(12) United States Patent
Shi et al.

(10) Patent No.: US 7,365,581 B2
(45) Date of Patent: Apr. 29, 2008

(54) REGULATED ADAPTIVE-BANDWIDTH PLL/DLL USING SELF-BIASING CURRENT FROM A VCO/VCDL

(75) Inventors: Xudong Shi, Sunnyvale, CA (US); Kun-Yung Chang, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/743,422

(22) Filed: May 2, 2007

(65) Prior Publication Data

US 2007/0200603 A1    Aug. 30, 2007

Related U.S. Application Data

(63) Continuation of application No. 10/770,435, filed on Feb. 3, 2004, now abandoned.

(60) Provisional application No. 60/506,540, filed on Sep. 26, 2003.

(51) Int. Cl.
*H03L 7/06* (2006.01)

(52) U.S. Cl. .................. 327/156; 327/159; 331/17

(58) Field of Classification Search ............... None
See application file for complete search history.

(56) References Cited

U.S. PATENT DOCUMENTS

| | | | |
|---|---|---|---|
| 5,629,650 A | | 5/1997 | Gersbach et al. |
| 5,727,037 A | * | 3/1998 | Maneatis .............. 375/376 |
| 5,740,213 A | * | 4/1998 | Dreyer .................. 375/374 |

(Continued)

FOREIGN PATENT DOCUMENTS

DE    19949782 C1    10/1999

OTHER PUBLICATIONS

Chang, et al., "A 0.4-4Gb/s CMOS Quad Transceiver Cell using On-chip Regulated Dual-Loop PLLS," 2002 Symposium on VLSI Circuits Digest of Technical Papers.

(Continued)

*Primary Examiner*—N. Drew Richards
*Assistant Examiner*—An T. Luu
(74) *Attorney, Agent, or Firm*—Vierra Magen Marcus & DeNiro LLP

(57) ABSTRACT

A PLL/DLL circuit is current self-biased responsive to a current $I_{ld}$ provided from a voltage regulator to a VCO or VCDL. Bias current $I_{bias}$, which is proportional to $I_{ld}$, is provided to components of the PLL/DLL, such as a charge pump or loop resistor, from an interconnect coupled to the voltage regulator. In an embodiment of the present invention, a component of the PLL/DLL includes a bias-generating device, such as a MOSFET p-type transistor having a drain coupled to the interconnect. In an embodiment of the present invention, a voltage regulator includes an AMP having a bias-generating device, such as a p-type transistor, acting as a current source, having a source coupled to $V_{dd}$ and a drain coupled to the interconnect. The gate of the bias-generating device is coupled to the gate of four other p-type devices. Each of the four p-type devices has a source coupled to $V_{dd}$. The drains of the first and second p-type transistors are coupled to an output providing $I_{ld}$. A negative input of the AMP ("INM") is coupled to the gate of a first n-type transistor and a positive input of the AMP ("INP") is coupled to the gate of a second n-type transistor. The drains of the first and second n-type transistors are coupled to the drains of the second and third p-type transistors. The sources of the first and second n-type transistors are coupled to the drain of a third n-type transistor. The source of the third n-type transistor is coupled to ground and the gate is coupled to a fourth n-type transistor. The drain of the fourth n-type transistor is coupled to the drain of the fourth p-type transistor and the source of the fourth n-type transistor is coupled to ground.

12 Claims, 7 Drawing Sheets

U.S. PATENT DOCUMENTS

| | | |
|---|---|---|
| 5,909,150 A | 6/1999 | Kostelnik et al. |
| 5,942,947 A | 8/1999 | Bhagwan |
| 6,329,882 B1 * | 12/2001 | Fayneh et al. ................ 331/10 |
| 6,441,660 B1 * | 8/2002 | Ingino, Jr. .................. 327/156 |
| 6,504,438 B1 | 1/2003 | Chang et al. |
| 6,556,088 B1 * | 4/2003 | Dietl et al. ................... 331/17 |
| 6,693,496 B1 * | 2/2004 | Lebouleux ................. 331/185 |
| 6,710,665 B2 * | 3/2004 | Maneatis ..................... 331/17 |
| 6,809,600 B2 | 10/2004 | Chang et al. |
| 6,911,476 B2 | 6/2005 | Davison et al. |
| 6,928,128 B1 | 8/2005 | Sidiropoulos |

OTHER PUBLICATIONS

Sidiropoulos, et al., "A Semidigital Dual Delay-Locked Loop," IEEE Journal of Solid-State Circuits, vol. 32, No. 11, Nov. 1997.

Maneatis, "Low-Jitter Process-Independent DLL and PLL Based on Self-Biased Techniques," IEEE Journal of Solid-State Circuits, vol. 31, No. 11, Nov. 1996.

Sidiropoulos, et al., "Adaptive Bandwidth DLLs and PLLs using Regulated Supply CMOS Buffers," 2000 Symposium on VLSI Circuits Digest of Technical Papers, 2000 IEEE.

* cited by examiner

US 7,365,581 B2

REGULATED ADAPTIVE-BANDWIDTH PLL/DLL USING SELF-BIASING CURRENT FROM A VCO/VCDL

PRIORITY DATA

This application is a continuation of U.S. patent application Ser. No. 10/770,435 filed Feb. 3, 2004, now abandoned, which claims priority to U.S. Provisional Patent Application Ser. No. 60/506,540 filed Sep. 26, 2003.

FIELD OF THE INVENTION

The present invention relates to a circuit tracking an input signal, and in particular, a phase locked loop ("PLL") or delay locked loop ("DLL") circuit.

BACKGROUND OF THE RELATED ART

A PLL or DLL ("PLL/DLL") is an electronic circuit, which generates an output signal that has a well-controlled relationship in phase/delay and frequency to an input signal.

PLL/DLLs are used in numerous applications including, for example, I/O interfaces of digital integrated circuits, memory systems, processors, frequency multiplication or frequency tracking.

A PLL/DLL may be biased using a special bandgap bias circuit or a dedicated circuit other than the PLL/DLL. However, using a special bandgap bias circuit may increase cost, design complexity, noise and power consumption in a PLL/DLL application.

Alternatively, a PLL/DLL may be voltage self-biasing, or a voltage generated by the PLL/DLL biases circuit components of the PLL/DLL. This voltage self-biasing allows for process independent PLL/DLL bandwidth tracking to achieve a relatively high input bandwidth for tracking an input signal and reduces voltage-controlled oscillator ("VCO") or voltage-controlled delay line ("VCDL") noise. In addition, self-biasing allows for eliminating special bandgap bias circuits.

However, voltage biasing PLL/DLLs by distributing a voltage to various components has many disadvantages. First, voltage biasing PLL/DLLs may not have adequate bandwidth tracking for particular applications. A bias-generating device, such as a metal-oxide field-effect transistor ("MOSFET"), in the various PLL/DLL components receiving the biasing voltage typically must have the same threshold voltage $V_T$ as the matching device generating the bias voltage. If the devices are not the same, mismatch is introduced. Also, a voltage bias-generating device typically must operate in a saturation region in order for a good matching. Under certain device operation conditions, such as a slow corner, voltage bias-generating devices will not be in a saturation region.

Therefore, it is desirable to provide a current self-biased PLL/DLL without the above-described disadvantages.

DETAILED DESCRIPTION

A PLL/DLL circuit is current self-biased using current provided from a circuit component in the PLL/DLL in embodiments of the present invention. A copy of current $I_{ld}$ provided to a VCO or a VCDL from a voltage regulator is used to bias circuit components of a PLL/DLL in embodiments of the present invention. Current $I_{ld}$ represents frequency or delay information of a PLL or DLL, respectively. Bias current $I_{bias}$, which is proportional to current $I_{ld}$, is provided to circuit components of the PLL/DLL, such as a charge pump, phase mixer, amplifier, clock buffer and loop resistor, from an interconnect in embodiments of the present invention.

Figure 1A:
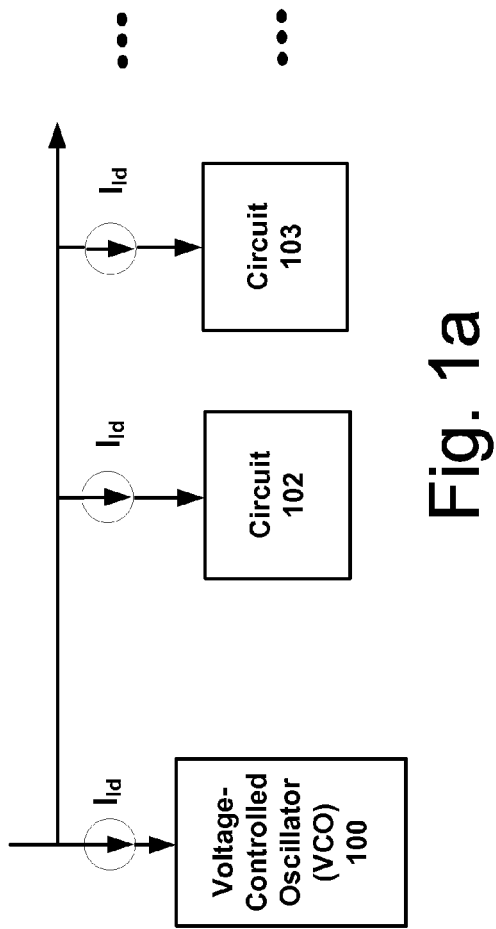
FIGS. 1a-b illustrate providing current representing frequency or delay to circuit components in a PLL or DLL, respectively, according to an embodiment of the present invention.
Figure 1B:
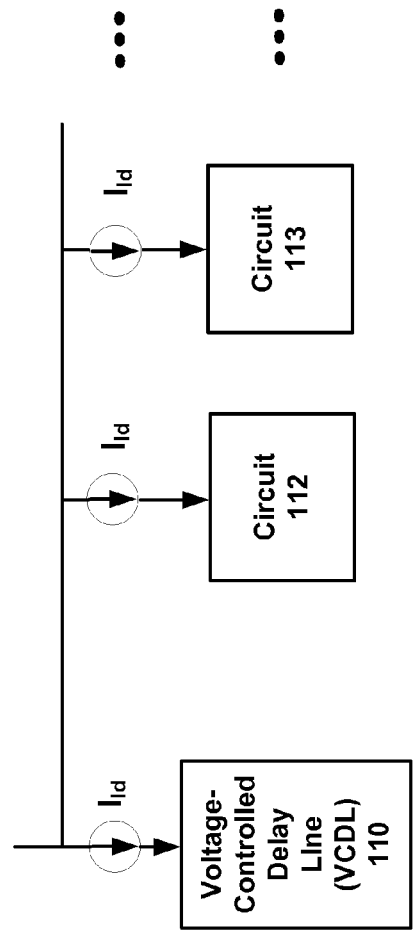

FIGS. 1a and 1b illustrate portions of a PLL and DLL, respectively. In particular, current $I_{ld}$ is input to VCO 100 and VCDL 110, while copies of current $I_{ld}$ are provided to circuit components 102 and 103, and circuit components 112 and 113, respectively. In an embodiment of the present invention, a circuit component of the PLL/DLL includes a bias-generating device, such as a MOSFET p-type transistor having a drain coupled to the interconnect.

In an embodiment of the present invention, an operational amplifier ("AMP") in a voltage regulator includes a bias-generating device, such as a p-type transistor having a source coupled to $V_{dd}$ and a drain coupled to the interconnect. The gate of the bias-generating device is coupled to the gate of four other p-type devices. Each of the four p-type devices has a source coupled to voltage $V_{dd}$. The drains of the first and second p-type transistors are coupled to an output providing current $I_{ld}$. A negative input ("INM") of the operational amplifier ("AMP") in the voltage regulator is coupled to the gate of a first n-type transistor and a positive input ("INP") of the AMP is coupled to the gate of a second n-type transistor. The drains of the first and second n-type transistors are coupled to the drains of the second and third p-type transistors. The sources of the first and second n-type transistors are coupled to the drain of a third n-type transistor. The source of the third n-type transistor is coupled to ground and the gate is coupled to a source and gate of a fourth n-type transistor. The drain of the fourth n-type transistor is coupled to the drain of the fourth p-type transistor and the source of the fourth n-type transistor is coupled to ground.

Figure 2:
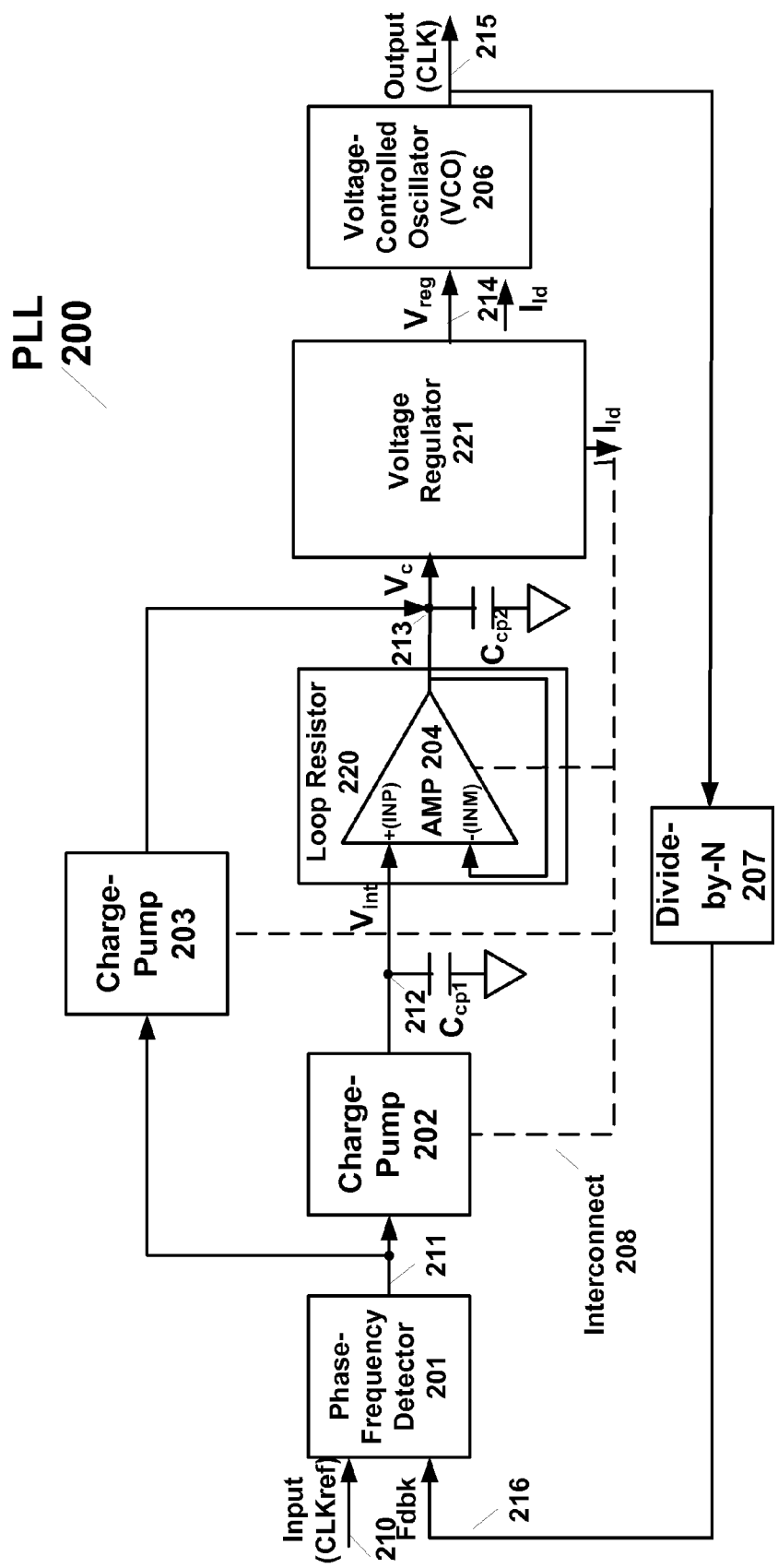
FIG. 2 is architecture of a PLL according to an embodiment of the present invention.

FIG. 2 illustrates a regulated adaptive-bandwidth PLL 200 having an interconnect (shown as dashed lines) 208 to provide a copy of current $I_{ld}$ provided to a VCO 206 to PLL circuit components according to an embodiment of the present invention. In an alternate embodiment of the present invention, a bias current $I_{bias}$, which is proportional to a copy of current $I_{ld}$, is provided to PLL circuit components by way of interconnect 208.

PLL 200 includes circuit components such as phase-frequency detector 201, charge-pump ("CP") 202, CP 203, a loop resistor 220 comprising AMP 204, a voltage regulator 221, VCO 206, and divide-by-N 207. In an embodiment of the present invention, voltage regulator 221 includes an AMP. As one of ordinary skill in the art would appreciate, more or less circuit components are provided in alternate embodiments of the present invention. For example, PLL 200 includes a filter circuit component in an embodiment of the present invention. VCO 206 generates an output signal on interconnect 215, such as a clock signal CLK, responsive to an input signal, such as a clock reference signal CLKref on interconnect 210 and a Fdbk signal on interconnect 216. PLL 200 is said to be in a phase-locking mode, and the oscillation period of the output signal CLK is adjusted in a phase-locking operation to track the phase of the clock reference signal CLKref.

In an embodiment of the present invention, an interconnect between circuit components is represented as a single line (dashed or solid) and represents a conductive element, wire or trace for transferring a signal between circuit components. In an alternate embodiment of the present invention, a single line between circuit components in the Figures represents multiple interconnections or a bus.

As shown in FIG. 2, phase-frequency detector 201 compares the input signal to the Fdbk signal and generates a phase difference signal on interconnect 211 to CPs 202 and 203. In particular, up and down signals are generated by phase-frequency detector 201. A voltage $V_{int}$ and charge-pump voltage $V_c$ are then generated on interconnects 212 and 213, respectively, by CPs 202 and 203 that time-averages the phase difference signal. Loop capacitance is represented by capacitance $C_{cp1}$ on interconnect 212 and capacitance $C_{cp2}$ on line 213. Charge-pump voltage $V_c$ is input to loop resistor 220, the output impedance of buffer AMP 204 and in particular a negative input INM of AMP 204, and an input of voltage regulator 221. Voltage $V_{int}$ is also provided to loop resistor 220, and in particular input INP of AMP 204. In an embodiment of the present invention, AMP 204 acts as a buffer. As one of ordinary skill in the art would appreciate, FIG. 2 illustrates an exemplary loop resistor 220, also known as an equivalent zero resistor, and many other loop resistors may be used in alternate embodiments of the present invention. A voltage regulator 221 then generates a buffered voltage $V_{reg}$ and current $I_{ld}$ on interconnect 214 to VCO 206. An output signal is provided on interconnect 215 that is connected to divide-by-N 207, which in turn provides a Fdbk signal on interconnect 216 to phase-frequency detector 201. In an embodiment of the present invention, N equals 4 or 5 and PLL 200 is used to track a clock reference signal CLKref.

In an embodiment of the present invention, interconnect 208 (shown as dashed lines) provides a bias current $I_{bias}$ to circuit components of PLL 200 which is proportional to current $I_{ld}$. In an alternate embodiment of the present invention, a copy of $I_{ld}$ is provided on interconnect 208. In an embodiment of the present invention, interconnect 208 includes a series of current mirrors. In an embodiment of the present invention, a circuit component in PLL 200, such as AMP 204, has a device, such as a MOSFET device, to bias the component responsive to current $I_{ld}$. Thus, PLL 200 is self-biasing by using a current $I_{ld}$ rather than a voltage from VCO 206.

Figure 3:
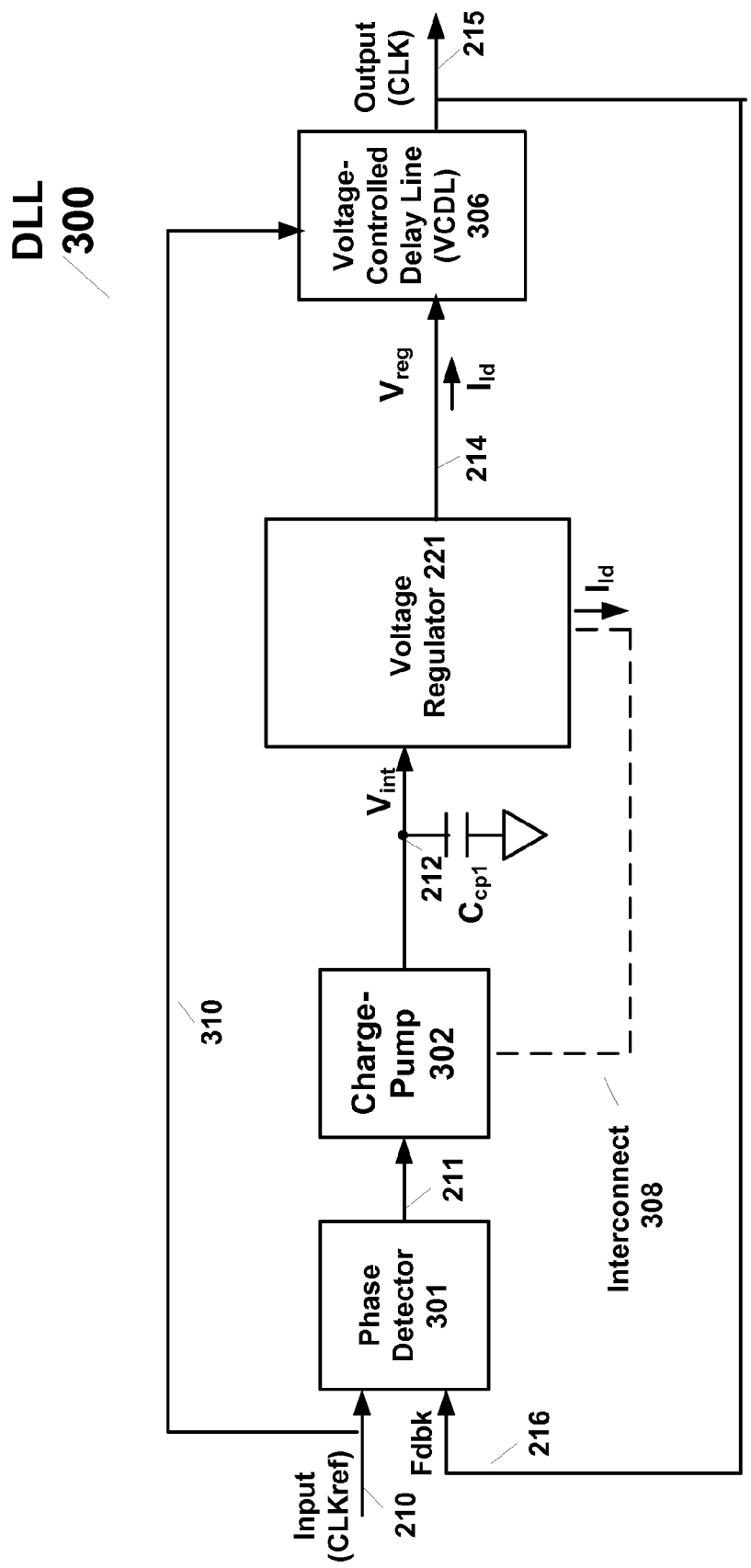
FIG. 3 is architecture of a DLL according to an embodiment of the present invention.

FIG. 3, similar to FIG. 2, illustrates a regulated adaptive-bandwidth DLL 300 having an interconnect 308 to provide a self-bias current $I_{bias}$, proportional to current $I_{ld}$, to bias DLL circuit components according to an embodiment of the present invention. In an alternate embodiment of the present invention, a copy of current $I_{ld}$ is provided to interconnect 308 in order to bias DLL circuit components.

DLL 300, like PLL 200, includes circuit components such as phase detector 301, charge pump ("CP") 302, voltage regulator 221, and VCDL 306. In an embodiment of the present invention, voltage regulator 221 includes an AMP.

As one of ordinary skill in the art would appreciate, more or less circuit components are provided in alternate embodiments of the present invention. For example, DLL 300 includes a filter circuit component in an embodiment of the present invention. VCDL 306 generates an output signal on interconnect 215, such as a clock signal CLK, responsive to an input signal, such as a clock reference signal CLKref on interconnect 210 and a Fdbk signal on interconnect 216. DLL 300 is said to be in a locking mode, and the delay of the output signal CLK is incrementally adjusted in a delay-locking operation to track the delay of the clock reference signal CLKref.

Phase detector 301 compares the input signal to the Fdbk signal and generates a delay signal on interconnect 211 to CP 302. An input signal, such as a clock reference signal CLKref, is also provided to VCDL 306 on interconnect 310. In particular, up and down signals are generated by phase detector 301. A voltage $V_{int}$ is then generated on interconnect 212 by CP 302 to voltage regulator 221. CP capacitance is represented by capacitance $C_{cp1}$ on interconnect 212. A voltage regulator 221 then generates a buffered voltage $V_{reg}$ on interconnect 214 to VCDL 306. A copy of current $I_{ld}$ or current $I_{bias}$ is then provided to interconnect 308 in embodiments of the present invention. A Fdbk signal is provided on interconnect 216 to phase detector 301.

In an embodiment of the present invention, interconnect 308 (shown as dashed lines) provides a bias current $I_{bias}$ to circuit components of DLL 300 which is proportional to current $I_{ld}$. In an embodiment of the present invention, interconnect 308 is a series of current mirrors. In an embodiment of the present invention, a circuit component in DLL 300 has a bias-generating device, such as a MOSFET device to bias the component responsive to current $I_{ld}$. Thus, DLL 300 is self-biasing by using a current $I_{ld}$ rather than a voltage from VCDL 306.

Figure 5:
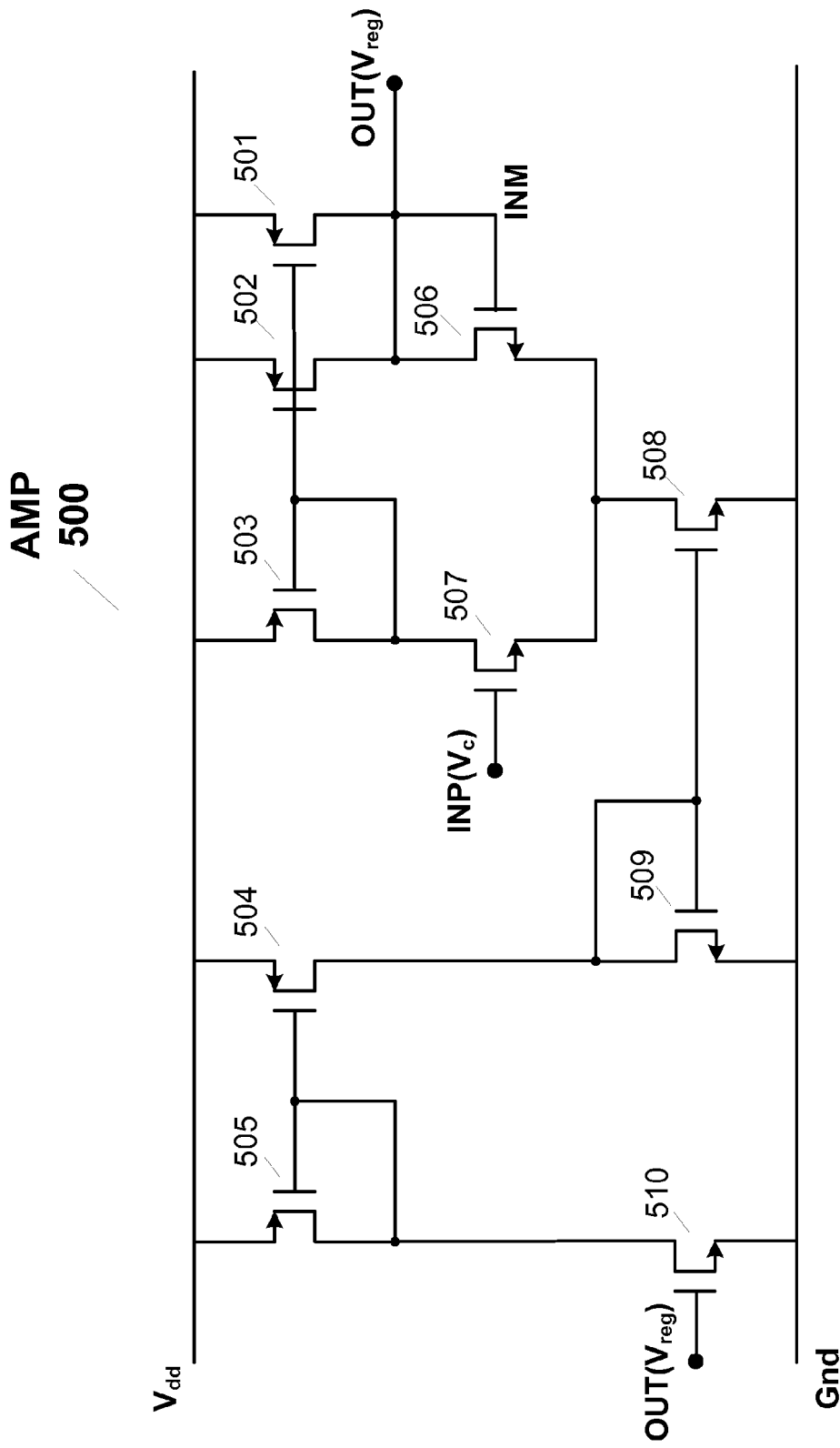
FIG. 5 is a schematic of a portion of a voltage regulator shown in FIGS. 2 and 3.

FIG. 5 illustrates a portion of a voltage regulator 221 and in particular a schematic of a prior art AMP 500. AMP 500 illustrates an AMP used in a voltage regulator 221 of a voltage self-biasing PLL/DLL. AMP 500 generates a voltage $V_{reg}$ at an output responsive to a charge-pump voltage $V_c$ applied to positive input INP on interconnect 213. AMP 500 includes five p-type transistors 501-505 having sources coupled to voltage $V_{dd}$. Gates of transistors 505 and 504 are coupled. Likewise, gates of transistors 503, 502 and 501 are coupled. An n-type transistor 507 has a drain coupled to a drain of transistor 503 as well as gates of transistors 503-501. A gate of transistor 507 is coupled to positive input INP and receives charge-pump voltage $V_c$. A gate of n-type transistor 506 is coupled to negative input INM and an output to provide voltage $V_{reg}$. The drains of transistors 502-501 are coupled to the drain of transistor 506. N-type transistor 508 has a drain coupled to sources of transistors 507-508. A source of transistor 508 is coupled to ground Gnd. N-type transistor 509 also has a source coupled to ground Gnd and a drain coupled to gates of transistors 509-508 as well as a drain of transistor 504. N-type transistor 510 has a gate coupled to an output to provide voltage $V_{reg}$. Transistor 510 also has a source coupled to ground Gnd and a drain coupled to a drain of transistor 505 and gates of transistor 505-504.

Figure 4:
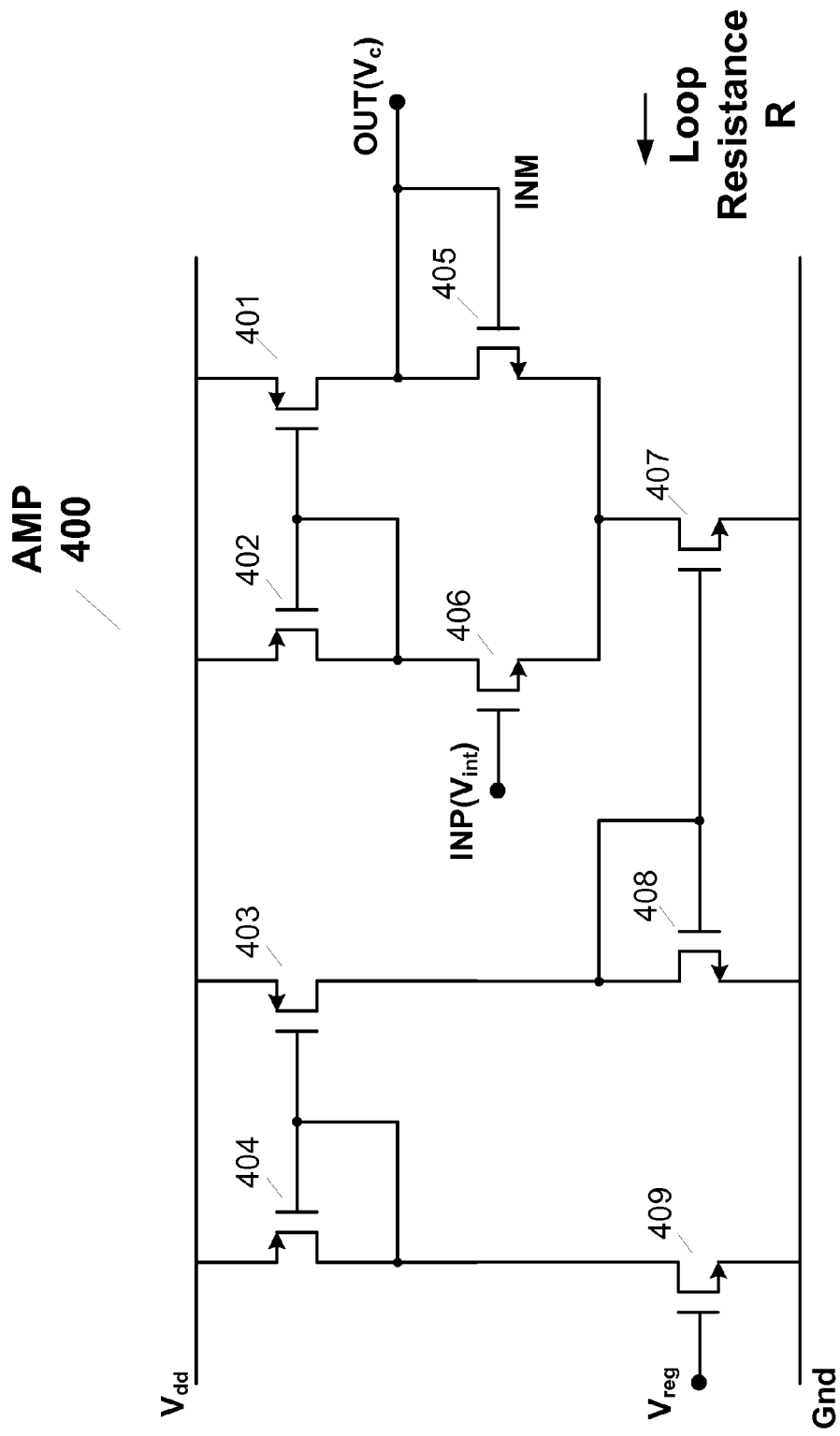
FIG. 4 is a schematic of a portion of a loop resistor shown in FIG. 2.

FIG. 4 illustrates a schematic of a portion of a loop resistor 220 and in particular a prior art AMP 400. AMP 400 illustrates an AMP used in a loop resistor of a voltage self-biasing PLL. In an embodiment of the present invention, AMP 400 is used as an AMP 204 seen in FIG. 2. Amp 400 generates a charge-pump voltage $V_c$ at an output responsive to charge pump current from charge pump 203 and a voltage $V_{int}$ applied to positive input INP on interconnect 212. Voltage $V_{reg}$ is also applied to the gate of transistor 409.

AMP 400, like AMP 500, includes four p-type transistors 401-404 having sources coupled to voltage $V_{dd}$. As stated above, loop resistor 220 may include more or less transistors in alternate embodiments of the present invention in order to provide an equivalent zero resistance. Gates of transistors 404 and 403 are coupled. Likewise, gates of transistors 402 and 401 are coupled. An n-type transistor 406 has a drain coupled to a drain of transistor 402 as well as gates of transistors 402-401. A gate of transistor 406 is coupled to positive input INP and receives voltage $V_{int}$. A gate of n-type transistor 405 is coupled to negative input INM and an output of charge pump 203 to provide voltage $V_c$. N-type transistor 407 has a drain coupled to sources of transistors 406-405. A source of transistor 407 is coupled to ground Gnd. N-type transistor 408 also has a source coupled to ground Gnd and a drain coupled to gates of transistors 408-407 as well as a drain of transistor 403. N-type transistor 409 has a gate coupled to voltage $V_{reg}$. Transistor 409 also has a source coupled to ground Gnd and a drain coupled to a drain of transistor 404 and gates of transistors 404-403. Thus, transistor 409 is used for tracking and responds to voltage $V_{reg}$ in a voltage self-biasing PLL.

However, using transistor 409 for tracking in a voltage self-biasing PLL/DLL has disadvantages. First, bias-generating devices, such as transistor 409, in CP 202, CP 203 and AMP 204 should have the same threshold voltage $V_T$ and device type as the matching device in a VCO 206 or VCDL 306. Second, bias-generating devices should be in saturation region to keep current ratio constant in order to keep the bandwidth tracking property. However, since voltage $V_{reg}$ will typically be close to a supply voltage $V_{dd}$ in slow corner operation condition, it will be difficult to keep transistor 409 in a saturation region.

In a preferred embodiment of the present invention, PLL 200 or DLL 300 bandwidth tracking depends on VCO 206 or VCDL 306 having the following properties:

$T_D$ proportional $R_{on} \times C_{LD}$, where: $C_{LD}$ is the load capacitance of delay cell buffers in VCO 206 or VCDL 306;

$T_D$ is the delay of delay cell buffers in VCO 206 or VCDL 306;

$R_{on}$ is the "on resistance" of a linear MOSFET device in the delay cell buffers in VCO 206 or VCDL 306.

$R_{on} = 1/|\beta \times (V_{reg} - V_T)|$ where $\beta$ is the process transconductance.

VCDL 306 gain is $K_{DL}$ proportional $C_{LD}/|\beta \times (V_{reg}-V_T)^2|$. (1)

VCO 206 gain is $K_V$ proportional $\beta/C_{LD}$. (2)

Each PLL and DLL has certain loop characteristics. For example, $\xi$ equals a loop-damping factor for a PLL. $W_n$ is a loop natural frequency and $W_{ref}$ is a loop input or reference frequency for a PLL or DLL.

To keep $\xi$ and $w_n/w_{ref}$ constant over process corners (independent of PLL/DLL input signal reference frequency), a charge pump current $I_{cp}$ and loop resistor R must have the following properties:

$I_{cp}$ proportional $(V_{reg}-V_T)^2$ (3)

$R$ proportional $1/\beta \times (V_{reg}-V_T)$ (4)

In a voltage self-biasing PLL/DLL, voltage $V_{reg}$ may be distributed to CP 202, CP 203 and loop resistor 220 to achieve these properties. Voltage $V_{reg}$ controls transistor 409 to generate bias current of AMP 404 in loop resistor 220 such that R is proportional $1/\beta \times (V_{reg}-V_T)$. Similarly, CP 202 and CP 203 currents are set.

In an embodiment of the present invention, a current $I_{ld}$ is distributed to circuit components in PLL 200 or DLL 300 on interconnects 208 and 308, respectively, instead of distributing $(V_{reg}-V_T)$, to achieve the same $\xi$ and $w_n/w_{ref}$ constant properties.

Thus, equations 1-4 are expressed as:

$K_{DL}$ proportional $C_{LD}/I_{ld}$ (5)

$K_V$ constant of $\beta/C_{LD}$ (6)

$I_{cp}$ proportional $I_{ld}$ (7)

$R$ proportional $1/\sqrt{I_{ld}}$ (8)

where $I_{ld}$ is VCO or VCDL current.

Figure 6:
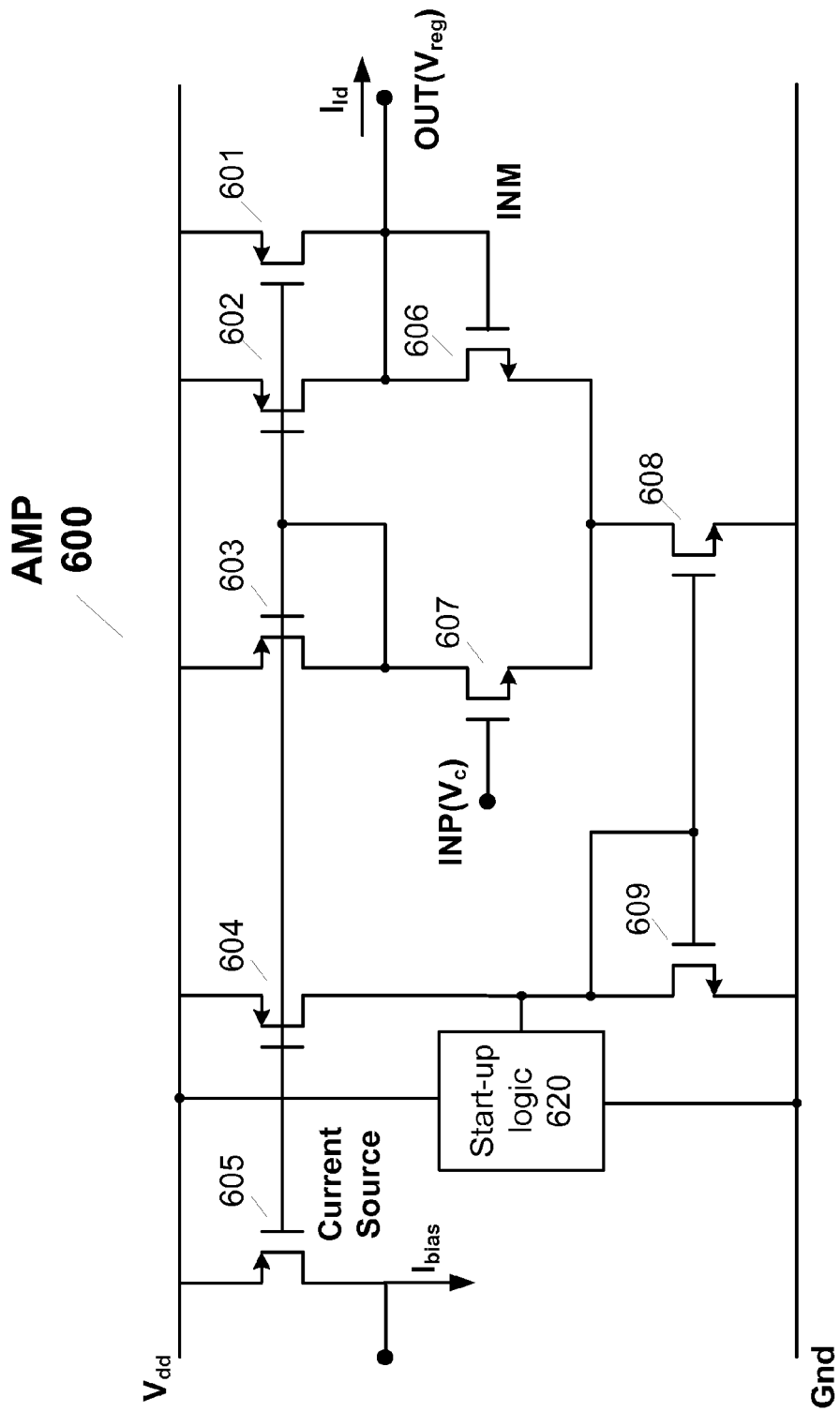
FIG. 6 is a schematic of an AMP 600 according to an embodiment of the present invention.

Replacing AMP 500, as seen in FIG. 5, with AMP 600 as seen in FIG. 6, current distribution is implemented to solve device threshold voltage $V_T$ mis-matching between circuit components. Further, current $I_{ld}$, or current $I_{bias}$, distribution can improve a MOSFET device operation range used in the various circuit components, since the circuit components do not have to have the same MOSFET device type as used in the VCO 206 or VCDL 306 cells.

AMP 600 having bias-generating device 605, shown in FIG. 6, is used instead of AMP 500 in an embodiment of the present invention. In an alternate embodiment of the present invention, AMP 600 is used in voltage regulator 221 shown in FIGS. 2 and 3. Bias-generating device 605 is a MOSFET device, and in particular a p-type device in an embodiment of the present invention. P-type transistor 605, acting as a current source, has a drain coupled to interconnect 208 and 308, respectively, and outputs bias current $I_{bias}$, which is proportional to current $I_{ld}$. The source of transistor 605 is coupled to voltage source $V_{dd}$. The gate of transistor 605 is coupled to the gates of p-type transistors 604-601. The sources of transistors 604-601 are also coupled to voltage source $V_{dd}$. The drains of transistors 602-601 are coupled to an output and a drain of n-type transistor 606. A gate of transistor 606 is also coupled to the output and input INM. N-type transistor 607 has a drain coupled to the drain and the gates of transistors 603 602. The gate of transistor 607 is coupled to input INP to receive voltage $V_c$. N-type transistor 608 has a drain coupled to the sources of transistors 606-607 and a source coupled to ground Gnd. A gate of transistor 608 is coupled to a gate and drain of n-type transistor 609, which has a drain, coupled to a drain of transistor 604 and a source coupled to ground Gnd.

In an embodiment of the present invention, start-up logic circuit 620 is used to initialize currents at the beginning of operation or power-up of AMP 600 until normal operation. Because AMP 600 is self-biased, there may not be VCO/VDL currents at power-up and thus AMP 600 may not operate properly without the initial currents provided by start-up logic circuit 620.

Figure 7:
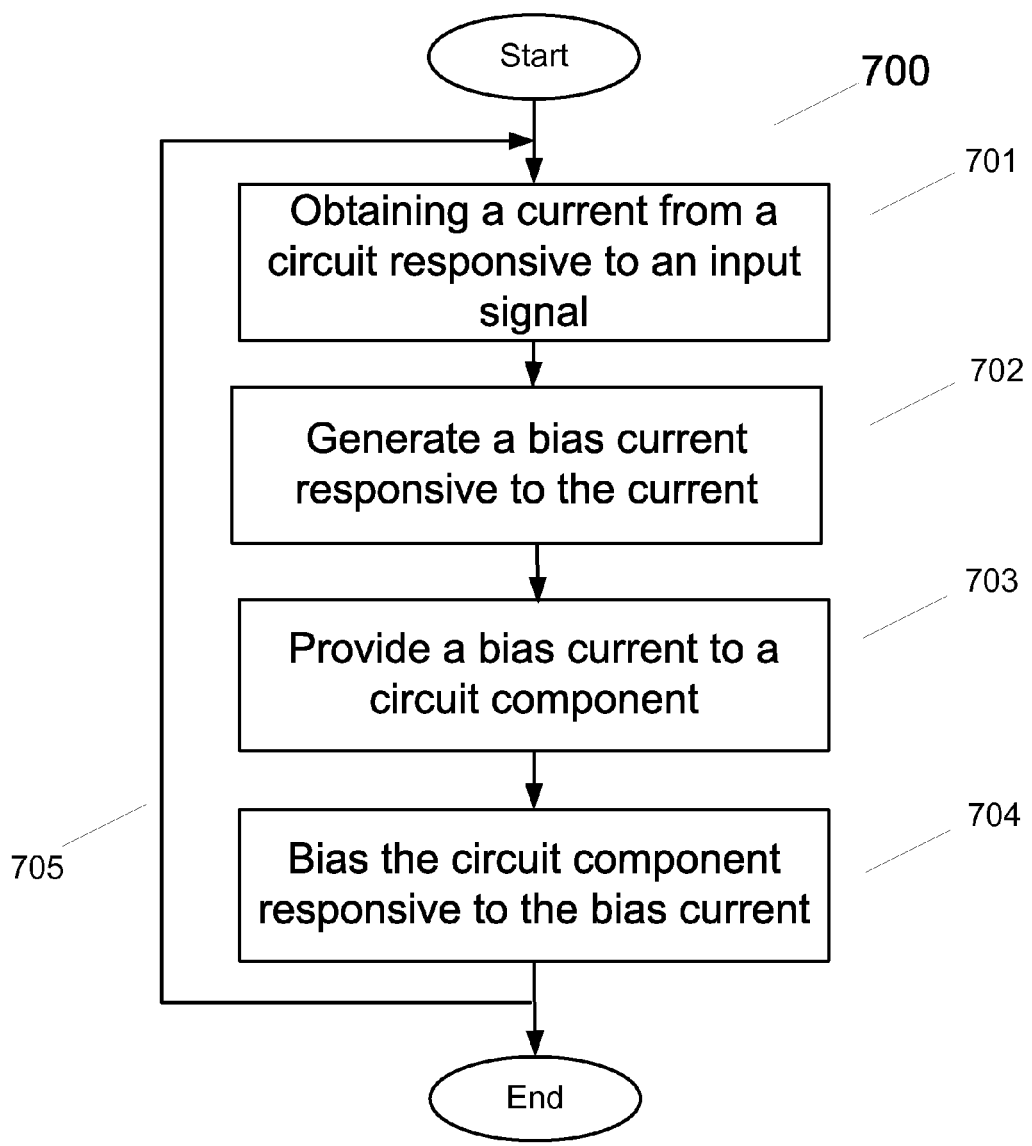
FIG. 7 is a method according to an embodiment of the present invention.

FIG. 7 illustrates a method 700 according to an embodiment of the present invention. In alternate embodiments of the present invention, steps illustrated in FIG. 7 are carried out by hardware, software or a combination thereof. In alternate embodiments, the circuit components illustrated in FIGS. 2, 3 and 6, carry out the steps illustrated in FIG. 7. As one of ordinary skill in the art would appreciate, other steps that are not shown may be included in various embodiments of the present invention.

Method 700 begins at step 701 where a current is obtained from a circuit responsive to an input signal. In an embodiment of the present invention, a current $I_{ld}$ is obtained from an input to VCO 206 or VCDL 306 shown in FIGS. 2 and 3, respectively. In a PLL embodiment of the present invention, current $I_{ld}$ is generated in response to an input signal and Fdbk signal on interconnects 210 and 216, respectively. In a DLL embodiment of the present invention, current $I_{ld}$ is generated in response to an input signal and Fdbk signal on interconnects 210 and 216, respectively. Step 702 illustrates generating a bias current in response to obtaining the current from the circuit. In an embodiment of the present invention, bias current $I_{bias}$ is generated in response to current $I_{ld}$ obtained from PLL 200 or DLL 300. Step 703 illustrates providing a bias current to a circuit component. In embodiments of the present invention, bias current $I_{bias}$ is provided to circuit components of PLL 200 and DLL 300 by interconnects 208 and 308 as seen in FIGS. 2 and 3, respectively. In particular, a bias current $I_{bias}$ is provided to circuit components in PLL 200 including loop resistor 220 having AMP 204, CP 202 and CP 203. A circuit component is then biased as illustrated by step 704. In an embodiment of the present invention, these steps repeat as long as a PLL/DLL is in an operation mode or power is supplied as illustrated by loop 705.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A phase locked loop circuit, comprising:
   a phase-frequency detector to provide a phase difference signal in response to an input signal and a feedback signal;
   a first charge-pump, coupled to the phase-frequency detector, to provide a first voltage in response to the phase difference signal;
   a second charge-pump, coupled to the phase-frequency detector, to provide a second voltage in response to the phase difference signal;
   a loop resistor, coupled to the first charge-pump, to provide a buffered voltage responsive to the first voltage;
   a voltage regulator, coupled to the loop resistor and the second charge-pump, to provide a current in response to the buffered voltage and second voltage, wherein the voltage regulator includes a bias-generating device to provide a bias current;
   a voltage-controlled oscillator, coupled to the voltage regulator, to provide the feedback signal in response to the current; and,
   an interconnect, coupled to the voltage regulator, the first charge-pump, and the second charge-pump, to transfer the bias current,
   wherein the bias-generating device in the voltage regulator is a MOSFET device,
   wherein the MOSFET device is a first p-type transistor having a drain coupled to the interconnect and the first p-type transistor having a source coupled a voltage source,
   wherein the voltage regulator includes:
   a second p-type transistor having a gate coupled to a gate of the first p-type transistor and the second p-type transistor having a source coupled to the voltage source;
   a third p-type transistor having a gate coupled to the gate of the second p-type transistor and the third p-type transistor having a source coupled to the voltage source;
   a fourth p-type transistor having a gate coupled to the gate of the third p-type transistor and the fourth p-type transistor having a source coupled to the voltage source;
   a fifth p-type transistor having a gate coupled to the gate of the fourth p-type transistor and the fifth p-type transistor having a source coupled to the voltage source;
   a first n-type transistor having a drain coupled to a drain of the second p-type transistor, the first n-type transistor having a source coupled to ground and the first n-type transistor having a gate coupled to the drain of the second p-type transistor;
   a second n-type transistor having a drain coupled to a drain of the third p-type transistor, the drain of the second n-type transistor coupled to the gate of the third p-type transistor and the gate of the fourth p-type transistor, the second n-type transistor having a gate coupled to an input, and the second n-type transistor having a source;
   a third n-type transistor having a drain coupled to a drain of the fourth p-type transistor and a drain of the fifth p-type transistor, the third n-type transistor having a gate coupled to an output and the gate of the third n-type transistor coupled to the drain of the fourth p-type transistor and the drain of the fifth p-type transistor, and the third n-type transistor having a source; and,
   a fourth n-type transistor having a drain coupled to the source of the second n-type transistor and the source of the third n-type transistor, the fourth n-type transistor having a source coupled to ground and the fourth n-type transistor having a gate coupled to the gate of the first n-type transistor and the drain of the first n-type transistor.

2. A delay locked loop circuit, comprising:
   a phase detector to generate a phase difference signal in response to an input signal and a feedback signal;
   a charge-pump, coupled to the phase detector, to generate a voltage in response to the phase difference signal;
   a voltage regulator, coupled to the charge-pump, to provide a current in response to the voltage, wherein the voltage regulator includes a bias-generating device to provide a bias current;
   a voltage-controlled delay line, coupled to the voltage regulator, to provide the feedback signal in response to the current; and,
   an interconnect, coupled to the charge-pump and the voltage regulator, to transfer the bias current,
   wherein the bias-generating device in the voltage regulator is a MOSFET device, wherein the MOSFET device is a first p-type transistor having a drain coupled to the interconnect and the first p-type transistor having a source coupled to a voltage source, wherein the voltage regulator includes:

a second p-type transistor having a gate coupled to a gate of the first p-type transistor and the second p-type transistor having a source coupled to the voltage source;

a third p-type transistor having a gate coupled to the gate of the second p-type transistor and the third p-type transistor having a source coupled to the voltage source;

a fourth p-type transistor having a gate coupled to the gate of the third p-type transistor and the fourth p-type transistor having a source coupled to the voltage source;

a fifth p-type transistor having a gate coupled to the gate of the fourth p-type transistor and the fifth p-type transistor having a source coupled to the voltage source;

a first n-type transistor having a drain coupled to a drain of the second p-type transistor, the first n-type transistor having a source coupled to ground and the first n-type transistor having a gate coupled to the drain of the second p-type transistor;

a second n-type transistor having a drain coupled to a drain of the third p-type transistor, the drain of the second n-type transistor coupled to the gate of the third p-type transistor and the gate of the fourth p-type transistor, the second n-type transistor having a gate coupled to an input, and the second n-type transistor having a source;

a third n-type transistor having a drain coupled to a drain of the fourth p-type transistor and a drain of the fifth p-type transistor, the third n-type transistor having a gate coupled to an output and the gate of the third n-type transistor coupled to the drain of the fourth p-type transistor and the drain of the fifth p-type transistor, and the third n-type transistor having a source; and, a fourth n-type transistor having a drain coupled to the source of the second n-type transistor and the source of the third n-type transistor, the fourth n-type transistor having a source coupled to ground and the fourth n-type transistor having a gate coupled to the gate of the first n-type transistor and the drain of the first n-type transistor.

3. A circuit, comprising:

a first p-type transistor having a gate, the first p-type transistor having a drain to output a current proportional to an output current and the first p-type transistor having a source coupled to a voltage source;

a second p-type transistor having a gate coupled to the gate of the first p-type transistor and the second p-type transistor having a source coupled to the voltage source;

a third p-type transistor having a gate coupled to the gate of the second p-type transistor and the third p-type transistor having a source coupled to the voltage source;

a fourth p-type transistor having a gate coupled to the gate of the third p-type transistor and the fourth p-type transistor having a source coupled to the voltage source;

a fifth p-type transistor having a gate coupled to the gate of the fourth p-type transistor and the fifth p-type transistor having a source coupled to the voltage source;

a first n-type transistor having a drain coupled to a drain of the second p-type transistor, the first n-type transistor having a source coupled to ground and the first n-type transistor having a gate coupled to the drain of the second p-type transistor;

a second n-type transistor having a drain coupled to a drain of the third p-type transistor, the drain of the second n-type transistor coupled to the gate of the third p-type transistor and the gate of the fourth p-type transistor, the second n-type transistor having a gate coupled to an input, and the second n-type transistor having a source;

a third n-type transistor having a drain coupled to a drain of the fourth p-type transistor and a drain of the fifth p-type transistor, the third n-type transistor having a gate coupled to an output and the gate of the third n-type transistor coupled to the drain of the fourth p-type transistor and the drain of the fifth p-type transistor, and the third n-type transistor having a source; and, a fourth n-type transistor having a drain coupled to the source of the second n-type transistor and the source of the third n-type transistor, the fourth n-type transistor having a source coupled to ground and the fourth n-type transistor having a gate coupled to a gate of the first n-type transistor.

4. The circuit of claim 3, wherein the circuit is included in an operational amplifier to generate a buffered signal at the output in response to a signal at the input.

5. A phase locked loop circuit comprising:
a phase-frequency detector;
a charge-pump to provide an output current having a first value;
a supply regulator to provide a power supply and to sense a load current having a second value; and
a supply regulated oscillator to receive the load current,
wherein the supply regulated oscillator has a frequency based on the power supply,
wherein the first value is proportional to the second value.

6. The phase locked loop circuit of claim 5, further comprising:
another charge-pump to provide another output current having a third value,
wherein the third value is proportional to the second value.

7. The phase locked loop circuit of claim 5, further comprising:
a loop resistor having a resistance value,
wherein the resistance value is proportional to one divided by the square root of the second value.

8. The phase locked loop circuit of claim 5, further comprising:
another charge-pump to provide another output current having a third value; and
a loop resistor having a resistance value,
wherein the third value is proportional to the second value,
wherein the resistance value is proportional to one divided by the square root of the second value.

9. The phase locked loop circuit of claim 5, wherein the first and second values are different values.

10. The phase locked loop circuit of claim 8, wherein the first, second and third values are different values.

11. A delay locked loop circuit comprising:
a phase detector;
a charge-pump to provide an output current having a first value;
a supply regulator to provide a power supply and to sense a load current having a second value; and
a supply regulated delay line to receive the load current, wherein the supply regulated delay line has a delay based on the power supply,
wherein the first value is proportional to the second value.

12. The delay locked loop circuit of claim 11, wherein the first and second values are different values.

* * * * *